United States Patent

[11] 3,579,057

[72] Inventor Arthur Irwin Stoller
North Brunswick, N.J.
[21] Appl. No. 850,823
[22] Filed Aug. 18, 1969
[45] Patented May 18, 1971
[73] Assignee RCA Corporation

[54] METHOD OF MAKING A SEMICONDUCTOR ARTICLE AND THE ARTICLE PRODUCED THEREBY
11 Claims, 7 Drawing Figs.

[52] U.S. Cl. 317/234, 29/576
[51] Int. Cl. H01l 9/00
[50] Field of Search 317/234, 235, 234/48.3, 234/48.5, 234/48.7; 310/8.1

[56] References Cited
UNITED STATES PATENTS

| | | | |
|---|---|---|---|
| 2,554,324 | 5/1951 | Chambers | 310/8.1 |
| 2,858,730 | 11/1958 | Hanson | 317/234X |
| 3,088,556 | 5/1963 | Wannlund, Jr. et al. | 317/235X |
| 3,377,182 | 4/1968 | Bernuth | 317/235X |

*Primary Examiner*—James D. Kallam
*Attorney*—Glenn H. Bruestle

ABSTRACT: A portion of the surface of a body of single crystalline silicon is etched to provide a wall which is substantially perpendicular to the surface of the body. The body is formed with the surface oriented in a (110) crystallographic plane. The surface is then etched with a crystallographically selective etching solution, such as a hot caustic solution, along a (111) crystallographic plane which extends perpendicularly to the (110) oriented surface.

INVENTOR.
ARTHUR I. STOLLER
BY
Donald S. Cohen
ATTORNEY

METHOD OF MAKING A SEMICONDUCTOR ARTICLE AND THE ARTICLE PRODUCED THEREBY

BACKGROUND OF INVENTION

The present invention relates to a method of making a semiconductor article and the article produced thereby, and more particularly to a method of etching the surface of a body of single crystal silicon.

In the making of various semiconductor devices it is necessary to form grooves or holes in the surface of a body of single crystal semiconductor material. Such grooves or holes are generally formed by providing a mask on the surface of the semiconductor body with the mask having openings therein over the areas of the semiconductor body where the grooves or holes are to be provided. The grooves or holes are then formed by a chemical etching material which will etch the semiconductor material but which will not attack the mask.

It is known that the manner in which the etching of the single crystal semiconductor material will take place can be effected by the crystallographic presentation of the surface of the semiconductor material being etched. If there is no crystallographic selection of the surface being etched, the etching will occur not only normal to the surface of the body of the semiconductor material but also parallel to the surface of the material. This results in an uncutting of the mask which is on the surface being etched. If closely spaced grooves or holes are being etched, this undercutting of the mask limits the depth of the grooves or holes to about one-half the width of the spacing between the grooves or holes.

To overcome the problem of undercutting the mask, it has been proposed to use a semiconductor material body having the surface to be etched oriented along the (100) crystallographic plane and etch the grooves along the {111} planes which intersect the (100) oriented surface. Although this manner of etching substantially eliminates the undercutting of the mask, because of the angularly orientation of the {111} planes to the (100) oriented surface, the grooves so etched are V-shaped and are limited in depth to about 0.7 times the width of the opening in the mask. For many types of semiconductor devices it is desirable to etch grooves or holes which are substantially deeper than the width of the grooves or holes.

SUMMARY OF INVENTION

A body of single crystal silicon is provided with a flat surface which is oriented in the (110) crystallographic plane and which is etched along a (111) crystallographic plane extending perpendicularly to the flat surface.

DETAILED DESCRIPTION

Figure 1:
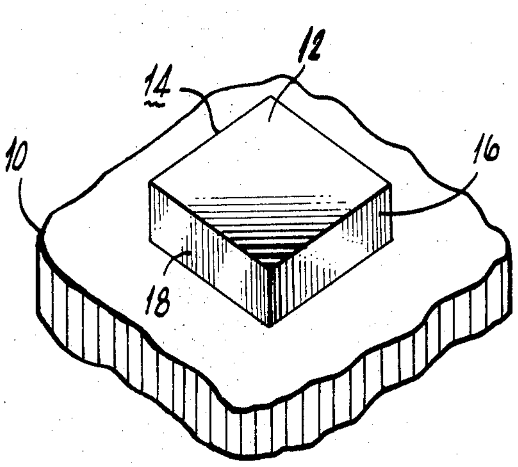
FIG. 1 is a perspective view of a semiconductor article formed by the method of the present invention.

For the method of the present invention, a body of single crystal semiconductor silicon is provided with a flat surface oriented in a (110) crystallographic plane. The silicon body will have two sets of {111} crystallographic planes which are perpendicular to the (110) oriented surface. One of the sets of {111} planes crosses the other set so that the outline of these planes on the (110) surface are diamond shapes in which the acute angles of each diamond are 70.53° and the obtuse angles are 109.47°. The (110) oriented surface of the body is then etched along the {111} planes. The silicon body can be etched with a hot caustic solution, such as boiling 25 percent aqueous solution of either potassium hydroxide or sodium hydroxide. To achieve selectivity of the area etched, the surface of the body is coated with a masking layer of a resist material, such as silicon dioxide, silicon nitride or silicon carbide, with the masking layer having openings therein over the areas of the surface which are to be etched. Since the {111} planes of the silicon are highly resistant to etching by a caustic solution while other crystallographic planes are readily etched, the etching will follow the {111} planes. Thus the {111} planes which are perpendicular to the surface of the silicon body, will become the walls of the portions of the body which are not etched away. This is illustrated in FIG. 1 which shows a body 10 of single crystalline silicon having a flat surface 12 which is oriented in the (110) plane. A portion of the surface 12 is etched away along two sets of {111} planes which extend perpendicularly to the surface 12. This provides the body 10 with a diamond-shaped projection 14 having the (110) oriented surface 12 as its top surface, parallel sidewalls 16 which extend along one set of the {111} planes and parallel sidewalls 16 and 18 are substantially perpendicular to the surface 12. The diamond-shaped top surface of the projection 14 has one diagonal which is longer than the other diagonal.

Figure 2:
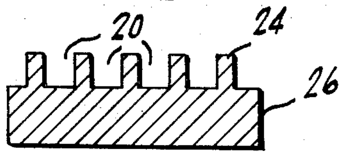
FIG. 2 is a sectional view of another semiconductor article formed by the method of the present invention.
Figure 3:
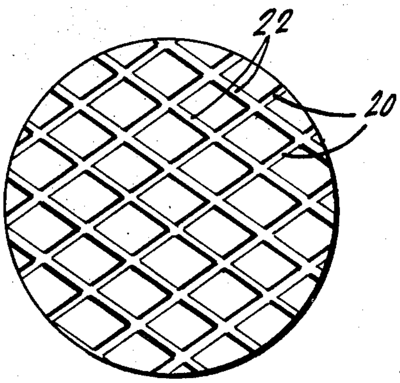
FIG. 3 is a top plane view of the semiconductor article of FIG. 2.

As shown in FIGS. 2 and 3, the above-described method can be used for forming two sets of narrow grooves 20 and 22 in the surface 24 of a body 26 of single crystalline silicon. To form the grooves 20 and 22, the silicon body 26 is formed with the surface 24 being oriented in the (110) crystallographic plane. A masking layer of a resist material is coated on the surface 24 and is provided with narrow, elongated openings which extend along the intersection of the {111} crystallographic planes which are perpendicular to the surface 24. The exposed portions of the surface 24 are then etched using a hot caustic solution, such as boiling 25 percent aqueous solution of potassium hydroxide or sodium hydroxide, to form the grooves 20 and 22. Since the etching follows the {111} planes, the walls of the grooves 20 and 22 are substantially perpendicular to the surface 24 of the body 26. Although the {111} planes are highly resistant to etching by caustic solutions, it has been found that there is some etching of the {111} planes causing a slight undercutting of the masking layer at the surface 24. The extent of the undercutting of the masking layer at such wall of the grooves has been found to be between one twenty-fifth and one-fiftieth of the depth of the grooves being etched. Thus, although the walls of the grooves 20 and 22 are not exactly perpendicular to the surface 24 of the body 26, the deviation from the perpendicular is so small that it is still possible to obtain deep grooves which are closely spaced. For example, grooves have been etched which are 0.002 inch deep, 0.0007 inch wide on 0.001 inch centers so as to provide islands of the silicon body between the grooves which are 0.00033 inch wide in the amount of 1000 islands per inch.

This method of etching grooves in a body of single crystalline silicon can be used in making various types of semiconductor articles. For example, in integrated circuits it is often desirable to provide dielectric isolation between discrete regions of the silicon body in which the elements of the circuit are formed. Using the method of the present invention, very narrow, deep grooves can be etched in the silicon body around the regions to be isolated. The grooves then provide dielectric isolation between the regions. However, the grooves can be filled with an electrical insulating material, such as silicon oxide, glass or plastic, to increase the breakdown voltage and to provide the silicon body with a smooth surface on which metalization interconnecting patterns can be easily provided. Since this method permits the etching of very narrow grooves, the grooves will take up a minimum amount of the surface area of the silicon body so that a greater portion of the surface area can be utilized for the circuit elements. Also, the silicon body for integrated circuits generally comprises a substrate of high resistivity single crystalline silicon having a layer of low resistivity single crystalline silicon epitaxially formed on a surface of the substrate. The elements of the circuit are formed in the epitaxial layer and the dielectric isolation extends through the epitaxial layer to the substrate. Since the method of the present invention permits the etching of deep grooves to provide the dielectric isolation, the silicon body can be provided with a thicker epitaxial layer in which the elements of the circuit can be formed.

Another use for this etching method is to divide a wafer of single crystalline silicon into small pieces or chips. Many types of semiconductor devices, such as diodes, transistors and integrated circuits, are made by forming a plurality of the devices in a single, relatively large, flat wafer of the single crystalline silicon. The wafer is then divided along lines extending between the devices to separate the devices. Since the method of the present invention permits the etching of deep grooves, by etching two sets of crossing grooves in the wafer in the manner previously described with regard to FIGS. 2 and 3 until the grooves are etched completely through the wafer, the wafer can be divided into a plurality of small pieces. The small pieces so formed will have sides which are substantially perpendicular to the faces of the pieces so that the pieces can be easily handled, particularly by automatic equipment. Also, as previously stated, the faces of the pieces will be diamond shaped having one diagonal longer than the other. This unique shape allows for ease of orienting the pieces.

Figure 5:
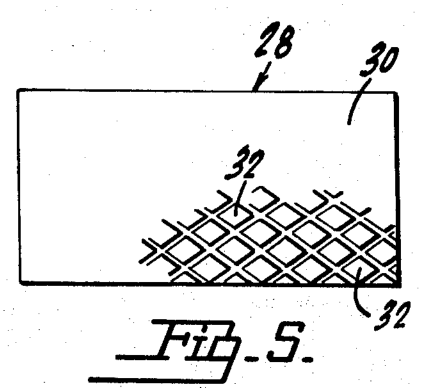
FIG. 5 is a top plane view of the feed-through array of FIG. 4.
Figure 4:
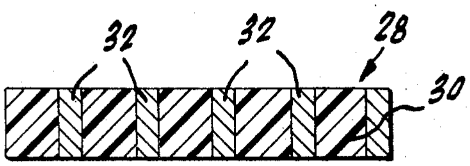
FIG. 4 is a sectional view of a feed-through array formed by the method of the present invention.

Referring to FIGS. 4 and 5, there is shown a feed-through array, generally designed as 28, which can be formed by using the etching method of the present invention. The feed-through array 28 comprises a flat sheet 30 of an electrical-insulating material, such as glass or plastic, and a plurality of spaced conductors 32 of single crystalline silicon embedded in and extending through the sheet 30. The ends of the conductors 32 are flush with the surface of the sheet 30.

Figure 6:
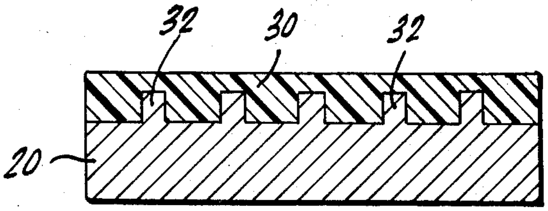
FIG. 6 is a sectional view illustrating a step in the method of making the feed-through array.

To make the feed-through array 28, one starts with a body of single crystalline silicon having a flat surface oriented along a (110) crystallographic plane, such as the body 20 shown in FIGS. 2 and 3. Two sets of crossing grooves, such as the grooves 20 and 22, are etched into the surface of the body in the manner previously described with regard to FIGS. 2 and 3. The grooves are etched to a depth equal to the desired length of the conductors 32. Thus, the islands of the body 20 within the grooves will constitute the conductors 32. As shown in FIG. 6, a sheet 30 of the electrical-insulating material, which is thicker than the length of the conductors 32, is then bonded to the etched surface of the body 20 under the application of heat and pressure so that the material of the sheet 30 flows into and fills the grooves in the body. Thus, each of the conductors 32 is surrounded by the material of the sheet 30. The body 20 is lapped or ground to the bottom of the grooves, and the sheet 30 is lapped or ground to the ends of the conductors 32. This leaves the spaced conductors 32 embedded in the sheet 30 with the ends of the conductors being flush with the surfaces of the sheet.

Since, as previously described, the method of the present invention permits the etching of narrow grooves which are closely spaced, a feed-through array can be provided having a large number of conductors per square inch. Also, the feed-through array can be provided with any desired number and arrangement of the conductors by properly designing the pattern of the layer of the resist material used as the etching mask. Thus, this method allows a great degree of flexibility and accuracy as to the number and location of the conductors in the feed-through array.

Figure 7:
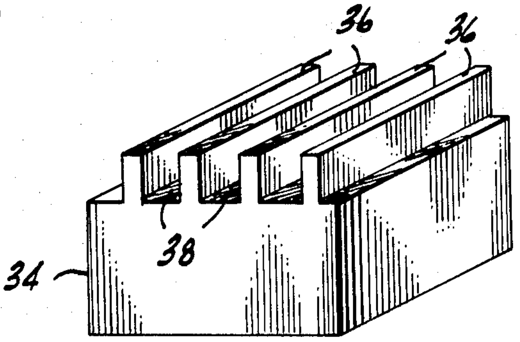
FIG. 7 is a perspective view of still another semiconductor article made by the method of the present invention.

Referring to FIG. 7 there is shown a body 34 of single crystalline silicon having a plurality of spaced, elongated bars 36 at a surface thereof. This structure is formed by providing the body 34 with a surface oriented in the (110) crystallographic plane. A masking layer of a resist material is coated on the surface and is provided with a plurality of spaced, narrow, elongated openings which extend along the intersection of one set of {111} planes which are perpendicular to the surface. The exposed portion of the surface of the body 34 are etched with a hot caustic solution to form the grooves 38 which follow the {111} planes. This forms the rods 36 which have side surfaces which are substantially perpendicular to the top surfaces of the rods.

In addition to etching grooves in the surface of a body of single crystalline silicon, the method of the present invention can also be used to etch holes in or through such a body. To etch a hole in the body, the masking layer on the (110) oriented surface of the body is provided with a diamond-shaped opening which follows the diamond-shaped outline of two sets of crossing {111} planes which are perpendicular to the surface. The exposed portion of the surface of the body is etched with a hot caustic solution. The etching follows the planes so as to form a hole having sides which are substantially perpendicular to the surface of the body.

I claim:

1. A semiconductor article comprising a body of single crystalline silicon having a surface lying in the (110) crystallographic plane, and a recess in said body having a plurality of walls each of which lies in a {111} crystallographic plane which extends perpendicularly to said surface.

2. A semiconductor article in accordance with claim 1 in which the recess is a groove in the surface of the silicon body with the sidewalls of the groove lying along {111} crystallographic planes which are perpendicular to said surface.

3. A semiconductor article in accordance with claim 2 including a plurality of grooves in the surface of the silicon body with the sidewalls of each of said grooves lying along {111} crystallographic planes which are perpendicular to said surface.

4. A semiconductor article in accordance with claim 3 in which the sidewalls of the grooves lie along {111} crystallographic planes which are in spaced parallel relation so that the grooves are in spaced parallel relation.

5. A semiconductor article in accordance with claim 3 in which the sidewalls of one of the grooves lies along (111) crystallographic planes which cross the (111) crystallographic planes along which the sidewalls of another groove lie.

6. A semiconductor article in accordance with claim 3 including two sets of grooves in the surface of the silicon body with the walls of the grooves in each set lying along spaced parallel {111} crystallographic planes and the grooves in one set cross the grooves in the other set.

7. A semiconductor article in accordance with claim 1 in which the recess is a diamond-shaped hole in the surface of the silicon body with each sidewall of the hole lying along a (111) crystallographic plane which is perpendicular to the said surface of the body.

8. A method of making a semiconductor article comprising the steps of forming a body of single crystal silicon with a flat surface oriented in the (110) crystallographic plane and etching said surface along a plurality of {111} crystallographic planes which extend perpendicularly to said surface providing a recess having a plurality of walls each of which extends perpendicularly to said surface.

9. A method in accordance with claim 8 including etching two sets of grooves in the surfaces of the silicon body with the walls of the grooves in each set extending along spaced parallel {111} crystallographic planes and with the grooves in one set crossing the grooves in the other set.

10. A method in accordance with claim 9 including etching the grooves completely through the silicon body to separate the pieces of the body bounded by the grooves.

11. A method in accordance with claim 9 including bounding a sheet of electrical-insulating material to the etched surface of the silicon body with the insulating material filling the grooves and surrounding the pieces of the body bounded by the grooves, removing the portion of the insulating material which is over the said surface of the silicon body to said surface of the body, and removing the portion of the body from the surface opposite to said etched surface to the bottoms of the grooves so as to provide a sheet of the insulating material having pieces of the silicon body embedded therein and extending therethrough.